(12) United States Patent
Liu et al.

(10) Patent No.: US 9,611,133 B2
(45) Date of Patent: Apr. 4, 2017

(54) FILM INDUCED INTERFACE ROUGHENING AND METHOD OF PRODUCING THE SAME

(71) Applicant: INVENSENSE, INC., San Jose, CA (US)

(72) Inventors: Fang Liu, San Jose, CA (US); Martin Lim, San Mateo, CA (US); Jong Il Shin, San Jose, CA (US); Jongwoo Shin, Pleasanton, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/667,169

(22) Filed: Mar. 24, 2015

(65) Prior Publication Data
US 2016/0115016 A1    Apr. 28, 2016

Related U.S. Application Data

(60) Provisional application No. 62/049,212, filed on Sep. 11, 2014.

(51) Int. Cl.
*B81C 1/00* (2006.01)
*B81B 3/00* (2006.01)

(52) U.S. Cl.
CPC ...... *B81B 3/001* (2013.01); *B81B 2201/0235* (2013.01); *B81B 2201/0242* (2013.01); *B81C 2201/115* (2013.01); *B81C 2203/0792* (2013.01)

(58) Field of Classification Search
CPC .............. H01L 27/10852; H01L 28/82; H01L 21/76254; H01L 21/76259; H01L 28/90; H01L 31/1892; H01L 21/30604
See application file for complete search history.

(56) References Cited

U.S. PATENT DOCUMENTS

| | | | | | |
|---|---|---|---|---|---|
| 4,219,373 | A | * | 8/1980 | Mochizuki | .......... H01L 21/2254 257/E21.148 |
| 5,364,664 | A | * | 11/1994 | Tsubouchi | .......... C23C 16/0227 257/E21.171 |
| 5,366,917 | A | * | 11/1994 | Watanabe | ......... H01L 27/10817 257/E21.012 |
| 5,623,243 | A | * | 4/1997 | Watanabe | ......... H01L 27/10817 257/309 |
| 5,804,140 | A | * | 9/1998 | Kishi | ................... G01N 17/043 422/53 |

(Continued)

FOREIGN PATENT DOCUMENTS

JP        2011029608 A   *   2/2011

OTHER PUBLICATIONS

European Search Report mailed Mar. 14, 2016 for European Patent Application No. 15192910.6, 7 pages.

*Primary Examiner* — Jaehwan Oh
(74) *Attorney, Agent, or Firm* — Amin, Turocy & Watson, LLP

(57) ABSTRACT

Various embodiments provide for a method for roughening a surface of a MEMs device or the surface of a CMOS surface. A first material can be deposited in a thin layer over a surface made of a second material. After heating, the first and second materials, they can partially melt and interdiffuse, forming an alloy. The first material can then be removed and the alloy is removed at the same time. The surface of the second material that is left behind has then been roughened due to the interdiffusion of the first and second materials.

28 Claims, 8 Drawing Sheets

(56) References Cited

U.S. PATENT DOCUMENTS

| | | | | |
|---|---|---|---|---|
| 5,856,007 A * | 1/1999 | Sharan | H01L 28/84 | 257/E21.013 |
| 5,858,838 A * | 1/1999 | Wang | C07K 14/005 | 257/E21.013 |
| 5,869,387 A * | 2/1999 | Sato | C30B 29/06 | 257/E21.133 |
| 6,015,986 A * | 1/2000 | Schuegraf | H01L 27/10852 | 257/298 |
| 6,022,775 A * | 2/2000 | Tsai | H01L 27/10852 | 257/E21.013 |
| 6,087,240 A * | 7/2000 | Gilchrist | H01L 28/82 | 257/E21.012 |
| 6,143,617 A * | 11/2000 | Shue | H01L 28/82 | 257/E21.012 |
| 6,211,077 B1 * | 4/2001 | Shimizu | H01L 28/84 | 257/65 |
| 6,288,421 B1 * | 9/2001 | Keeth | H01L 27/105 | 257/202 |
| 6,326,279 B1 * | 12/2001 | Kakizaki | H01L 21/76259 | 257/E21.57 |
| 6,448,131 B1 * | 9/2002 | Cabral, Jr. | H01L 27/1087 | 257/E21.013 |
| 6,455,917 B1 * | 9/2002 | Kuroki | H01L 28/84 | 257/309 |
| 6,506,669 B1 * | 1/2003 | Kuramasu | H01L 21/2022 | 257/E21.133 |
| 2001/0050390 A1 * | 12/2001 | Kawai | H01L 28/84 | 257/301 |
| 2003/0087503 A1 * | 5/2003 | Sakaguchi | H01L 21/3221 | 438/406 |
| 2003/0162006 A1 * | 8/2003 | Ikeguchi | B32B 27/08 | 428/220 |
| 2004/0051153 A1 * | 3/2004 | Yamamoto | H01L 21/28044 | 257/412 |
| 2004/0070018 A1 * | 4/2004 | Keeth | H01L 27/105 | 257/300 |
| 2004/0206998 A1 * | 10/2004 | Anma | H01L 28/84 | 257/306 |
| 2005/0196962 A1 * | 9/2005 | Demeurisse | C23F 1/28 | 438/689 |
| 2006/0118935 A1 * | 6/2006 | Kamiyama | H01L 21/30608 | 257/684 |
| 2006/0208326 A1 * | 9/2006 | Nasiri | B81C 1/00238 | 257/414 |
| 2006/0261042 A1 * | 11/2006 | Delattre | H01L 21/30604 | 216/92 |
| 2006/0267024 A1 * | 11/2006 | Murphy | H01L 21/26506 | 257/77 |
| 2007/0051975 A1 * | 3/2007 | Figuet | H01L 21/02381 | 257/183 |
| 2008/0035933 A1 * | 2/2008 | Nagata | H01L 29/4908 | 257/72 |
| 2008/0176381 A1 | 7/2008 | Aspar et al. | | |
| 2012/0115305 A1 | 5/2012 | Peng et al. | | |
| 2012/0255600 A1 * | 10/2012 | Bedell | H01L 31/03926 | 136/255 |
| 2013/0344444 A1 * | 12/2013 | Sonokawa | G03F 7/32 | 430/302 |
| 2014/0038392 A1 * | 2/2014 | Yonehara | H01L 21/304 | 438/463 |
| 2014/0145244 A1 * | 5/2014 | Daneman | B81C 3/001 | 257/254 |
| 2014/0264655 A1 | 9/2014 | Williams et al. | | |
| 2015/0232329 A1 * | 8/2015 | Classen | B81C 1/00269 | 257/782 |
| 2016/0053386 A1 * | 2/2016 | Mizutani | C23F 1/26 | 438/669 |

* cited by examiner

FILM INDUCED INTERFACE ROUGHENING AND METHOD OF PRODUCING THE SAME

PRIORITY CLAIM

This patent application is a non-provisional conversion of, and claims priority to, U.S. Provisional Application Ser. No. 62/049,212, filed on Sep. 11, 2014, entitled FILM INDUCED INTERFACE ROUGHENING AND METHOD OF PRODUCING THE SAME, which is incorporated herein by reference.

TECHNICAL FIELD

The subject disclosure relates to microelectromechanical systems (MEMS), and more particularly, to roughening a surface of a part of a MEMS device.

BACKGROUND

Fabrication platforms that integrate MEMS structures with electronics may utilize a wafer-to-wafer bonding process to directly integrate pre-fabricated MEMS wafers to off-the-shelf CMOS wafers at the wafer level. The MEMS devices and structures can have moving parts which may be integral to the performance and function of the MEMS device. If movement of these parts is prevented or inhibited, the function of the MEMs device may be impacted.

Stiction is an undesirable situation which arises when surface adhesion forces are higher than the mechanical restoring force of a MEMS structure. Stiction is recognized to often occur in situations where two surfaces with areas in close proximity come in contact. The greater the contact area at both macroscopic and microscopic levels, the risk of stiction increases. Therefore, as the roughness of the surfaces increase, the amount of stiction may decrease.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented layer.

In a non-limiting example, a method can comprise layering a first material over the surface of a second material, wherein the first material and the second material are different materials. The method can also include interdiffusing a portion of the first material and the second material at a predetermined temperature. The method can also include removing the first material, wherein the surface of the second material is roughened in response to removing the first material.

In another non-limiting example, a method can include depositing a film of germanium over a silicon surface and heating the germanium and the silicon surface to a predetermined temperature, wherein a portion of the germanium and a portion of silicon at a boundary layer between the film and the silicon surface melt at the predetermined temperature. The method can also include heating the germanium and the silicon surface to a predetermined temperature, wherein a portion of germanium and a portion of silicon are interdiffused, forming a germanium/silicon alloy. The method can also include removing the film of germanium.

In another non-limiting example, a method can include depositing a film of aluminum over a silicon surface and heating the aluminum and the silicon surface to a predetermined temperature, wherein a portion of the aluminum and a portion of silicon at a boundary layer between the film and the silicon surface melt at the predetermined temperature. The method can also include annealing the portion of aluminum and the portion of silicon wherein the portion of aluminum and the portion of silicon are interdiffused forming an aluminum/silicon alloy and removing the film of aluminum, wherein the aluminum/silicon alloy is removed with the film of aluminum.

In another non-limiting example, a method can include depositing a film of aluminum over a germanium surface. The method can also include heating the aluminum and the germanium surface to a predetermined temperature, wherein a portion of the aluminum and a portion of germanium at a boundary layer between the film and the germanium surface melt at the predetermined temperature, wherein the portion of aluminum and the portion of germanium are combined forming a aluminum/germanium alloy. The method can also include removing the film of aluminum.

The following description and the drawings contain certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
FIG. 1 depicts a non-limiting schematic diagram of an exemplary microelectromechanical systems (MEMS) surface with a deposited film according to various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the subject disclosure are described in the context of MEMS sensors. However, as further detailed below, various exemplary implementations can be applied to other areas of application specific integrated circuit board that perform analog to digital and digital to analog conversion of low amplitude signals, without departing from the subject matter described herein.

As used herein, the terms MEMS sensor, MEMS accelerometer, MEMS gyroscope, MEMS inertial sensor, MEMS acoustic sensor(s), MEMS audio sensor(s), and the like are used interchangeably unless context warrants a particular distinction among such terms. For instance, the terms can refer to MEMS devices or components that can measure acceleration, rate of rotation, a proximity, determine acoustic characteristics, generate acoustic signals, or the like.

Additionally, terms such as "at the same time," "common time," "simultaneous," "simultaneously," "concurrently," "substantially simultaneously," "immediate," and the like are employed interchangeably throughout, unless context warrants particular distinctions among the terms. It should be appreciated that such terms can refer to times relative to each other and may not refer to an exactly simultaneously action(s). For example, system limitations (e.g., download speed, processor speed, memory access speed, etc.) can account for delays or unsynchronized actions. In other embodiments, such terms can refer to acts or actions occurring within a period that does not exceed a defined threshold amount of time.

Various embodiments provide for a method for roughening a surface of a MEMs device or the surface of a CMOS surface. A first material can be deposited in a thin layer over a surface made of a second material. After heating, the first and second materials, they can partially melt and interdiffuse, forming an alloy. The first material can then be removed and the alloy is removed at the same time. The surface of the second material that is left behind has then been roughened due to the interdiffusion of the first and second materials. Alternatively the first material can be selectively removed leaving the alloy behind if the alloy is determined to have a desired higher roughened surface.

In an embodiment, the materials can be heated to a predetermined temperature where the materials form a eutectic system, where the bonding temperature is lower than either of the melting points of the first and second materials. In various embodiments, the first and second materials can be germanium and silicon, or aluminum and silicon, or even aluminum and germanium respectively.

Roughening the surface of the MEMS device and the CMOS wafers can reduce the amount of stiction, which is the static friction that needs to be overcome to enable relative motion of stationary objects in contact. In a dry environment, the force that dominates surface interaction is van der Waals force which is the sum of the attractive or repulsive forces between molecules or the electrostatic interaction of ions with one another, neutral molecules, or charged molecules. The van der Waals force can be shown by the following equation:

$$EtvdW = A \frac{-A'}{12\pi d2}$$

where EtvdW is the interaction energy, A is the contact area, A' is the Hamaker constant and d is the distance between the surfaces. In humid environments, the dominant force is the capillary force which is shown by $F_c = -\Delta p_{la} A$, where $\Delta p_{la}$ is the Laplace pressure, and A is the contact area. In both cases, as A decreases, the amount of stiction therefore also decreases. The surface roughening decreases the amount of real contact area, and so surface roughening decreases the amount of stiction.

Various other configurations or arrangements are described herein. It is noted that the various embodiments can include other components and/or functionality. It is further noted that the various embodiments can be included in larger systems, including, smart televisions, smart phones or other cellular phones, wearables (e.g., watches, headphones, etc.), tablet computers, electronic reader devices (i.e., e-readers), laptop computers, desktop computers, monitors, digital recording devices, appliances, home electronics, handheld gaming devices, remote controllers (e.g., video game controllers, television controllers, etc.), automotive devices, personal electronic equipment, medical devices, industrial systems, cameras, and various other devices or fields.

EXEMPLARY EMBODIMENTS

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

Figure 2:
FIG. 2 depicts a non-limiting schematic diagram of an exemplary MEMS surface with a deposited film interdiffusing with a surface material according to various non-limiting aspects of the subject disclosure.
Figure 3:
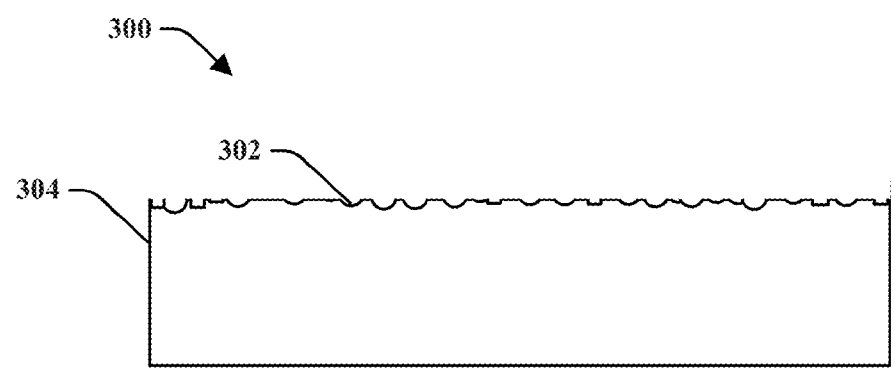
FIG. 3 depicts a non-limiting schematic diagram of an exemplary MEMS surface with a deposited film and mixed alloy removed according to various non-limiting aspects of the subject disclosure.

FIGS. 1-3 show three steps of a surface roughening procedure. FIG. 1 illustrates a non-limiting schematic diagram 100 of an exemplary microelectromechanical systems (MEMS) surface 104 with a deposited film 102 according to various non-limiting aspects of the subject disclosure. In FIG. 1, a layer or film of a first material 102 is shown deposited over the surface of a second material 104. The surface 104 can be the surface of a MEMs device or a CMOS wafer. In some embodiments, the surface 104 can be the capped surface of the MEMS device or CMOS wafer. In an embodiment, the surface 104 of the MEMS device or CMOS wafer may be a surface that comes into contact with another surface of a MEMs device or wafer, and so roughening of the surface may decrease the amount of stiction or static friction present when in contact with the other surface.

In an embodiment, the surface 104 can be a silicon surface, while in other embodiments, the surface can be germanium. The film 102 deposited over the surface 104 can be a germanium or aluminum film depending on the embodiment and the material of surface 104.

In FIG. 2, diagram 200 depicts the thin film/deposited material 202 and the surface material 206 being heated to a predetermined temperature where a portion of the material 202 and a portion of the surface material 206 melt, interdiffuse and form an alloy 204. This annealing process can form a eutectic bond between the deposited material 202 and the surface material 206 where the two materials form a eutectic system and interdiffuse. Since the eutectic temperature is below melting temperature of either material 202 and 206 alone, no damage is caused to the MEMS device or CMOS wafer. The interdiffusion layer 204, due to the interdiffusion, can have uneven borders on both sides of the layer, and it is in part this property which contributes to the roughening of the surface layer.

In FIG. 3, diagram 300 depicts the top layer (e.g., 102, 202, etc) having been etched away and the interdiffused layer (e.g., 204) can be removed with the top layer during the etching process and only the material 304 is left behind. Due to the uneven interdiffusion layer, the surface 302 that is left behind is roughened as shown in FIG. 3 so that when the surface 302 comes into contact with another MEMs device or CMOS wafer, the decreased real contact surface area results in lower capillary force and van der Waals force which results in decreased stiction.

It is to be appreciated that while a small portion of the interdiffusion layer and/or the deposited layer may be left behind in some places, in general the layers are removed nearly completely, leaving behind the material 304 with a roughened surface 302.

Figure 4:
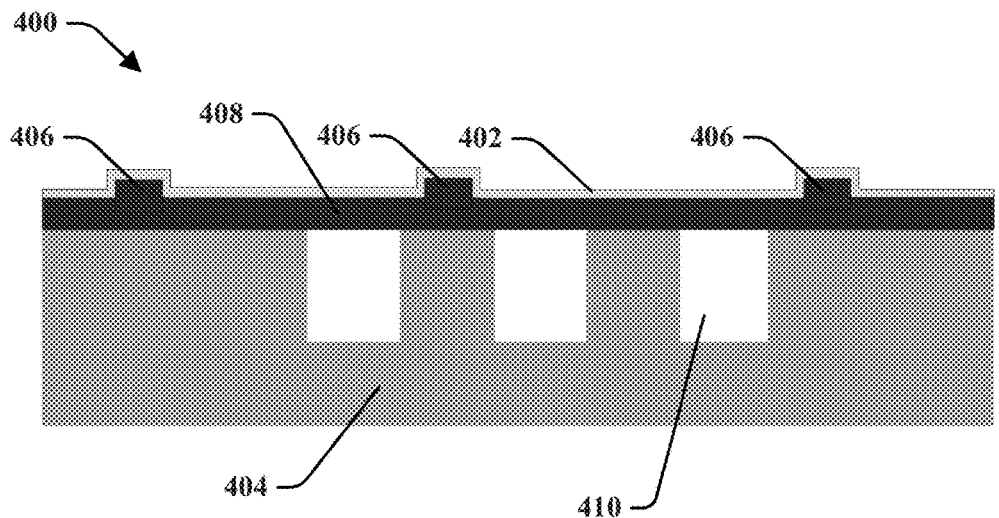
FIG. 4 depicts a non-limiting schematic diagram of an exemplary MEMS surface with a deposited germanium film over a silicon surface according to various non-limiting aspects of the subject disclosure.
Figure 5:
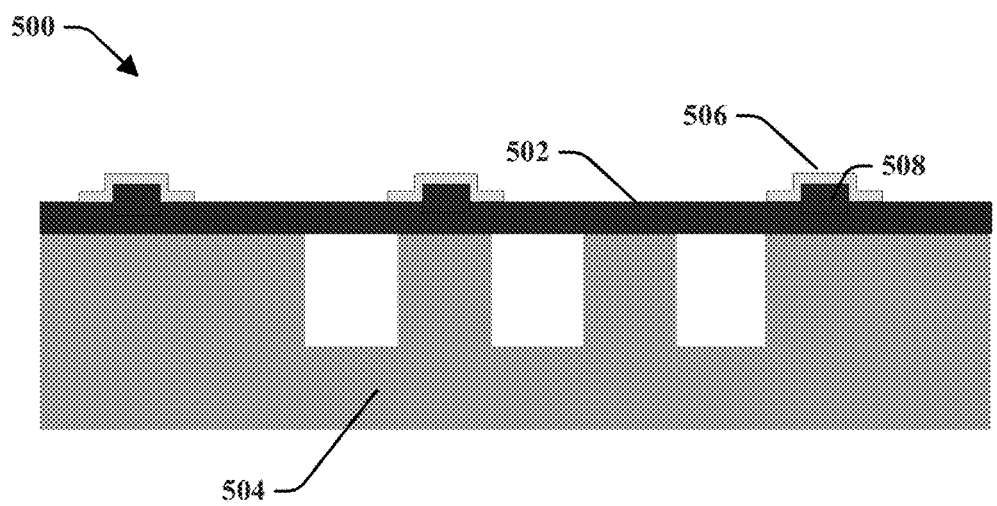
FIG. 5 depicts a non-limiting schematic diagram of an exemplary MEMS surface with a deposited germanium film and mixed germanium-silicon alloy partially removed according to various non-limiting aspects of the subject disclosure.

Turning now to FIGS. 4-5, illustrated are non-limiting schematic diagrams 400 and 500 of an exemplary wafer surface with a deposited germanium film over a silicon surface and a germanium film and mixed germanium-silicon alloy partially removed according to various non-limiting aspects of the subject disclosure.

In FIG. 4, a wafer 404 can have a silicon substrate 408 for a surface. The wafer 404 can include one more cavities (e.g., cavity 410) where a MEMs device or sensor or other electronic circuits may be placed or located. Interconnect points 406 can be formed on the surface of the substrate and these anchors or standoffs are used to connect the wafer 404 to a CMOS wafer. Since the silicon substrate 408 will be in contact with the CMOS wafer, it would be ideal to roughen the surface of the substrate to reduce possible stiction forces.

To that end, a thin layer of germanium 402 can be deposited over the silicon substrate 408 and interconnect points 406 after a standoff etch that formed the interconnect points 406. After deposition, the germanium 402 and silicon substrate 408 can be annealed. During the annealing process, the germanium 402 and silicon substrate 408 can be heated to a temperature where the portion of the germanium 402 and the silicon substrate 408 that are in contact with each other partially melt and interdiffuse forming a silicon-germanium alloy. The temperature to which the materials are heated can be the temperature at which the germanium and silicon form a eutectic bond, which is a lower temperature than the melting points of either silicon or germanium. In an embodiment, the eutectic temperature where germanium and silicon interdiffuse and form the alloy is around 700 degrees Celsius. The silicon and germanium can thus be heated to around or at least 700 degrees Celsius for a predetermined length of time to let the germanium and silicon fully interdiffuse and mix.

In FIG. 5, the germanium layer 402 has been removed via etching except for the germanium 506 that has been deposited over the interconnect points 508. The silicon-germanium alloy that was formed during the annealing has also been removed, leaving behind a surface 502 of the silicon substrate that has been roughened. The germanium 506 on the standoff anchors 508 can then be patterned for bonding, allowing the wafer 504 to be bonded to another wafer.

Figure 6:
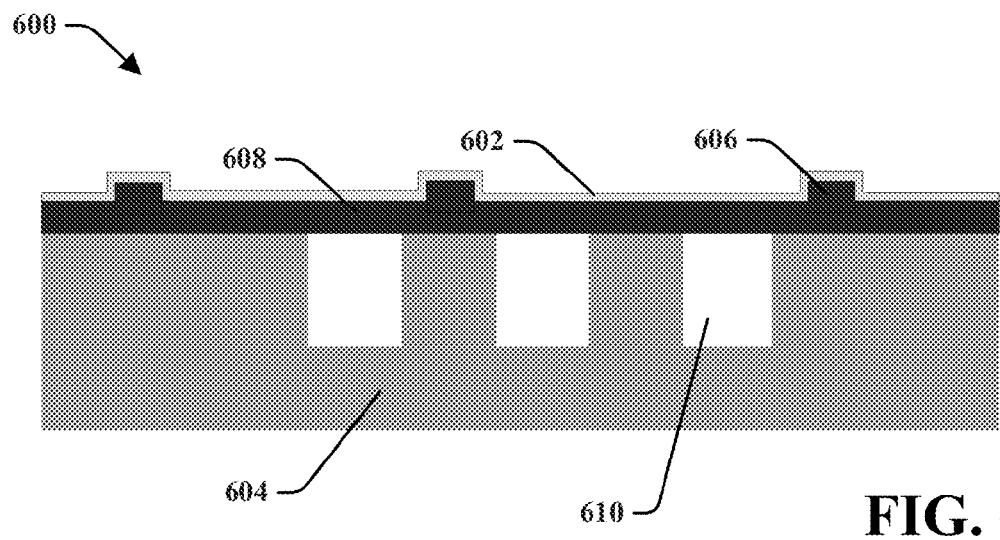
FIG. 6 depicts a non-limiting schematic diagram of an exemplary MEMS surface with a deposited aluminum layer over a silicon surface according to various non-limiting aspects of the subject disclosure.
Figure 7:
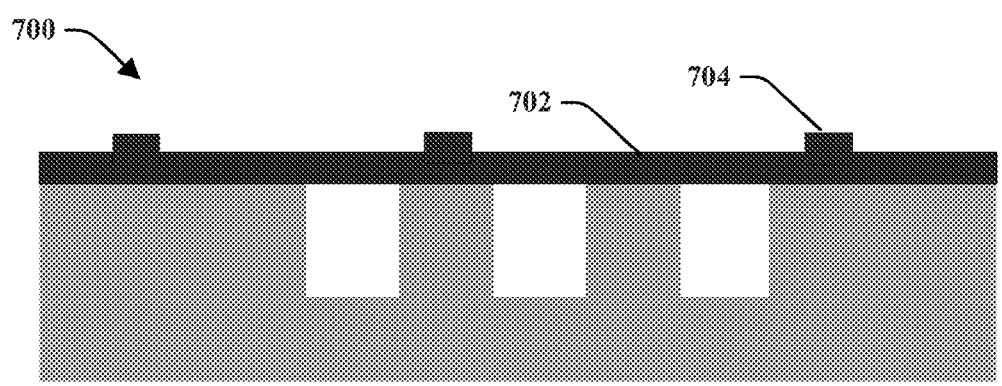
FIG. 7 depicts a non-limiting schematic diagram of an exemplary MEMS surface with a deposited aluminum layer and mixed aluminum-silicon alloy removed according to various non-limiting aspects of the subject disclosure.
Figure 8:
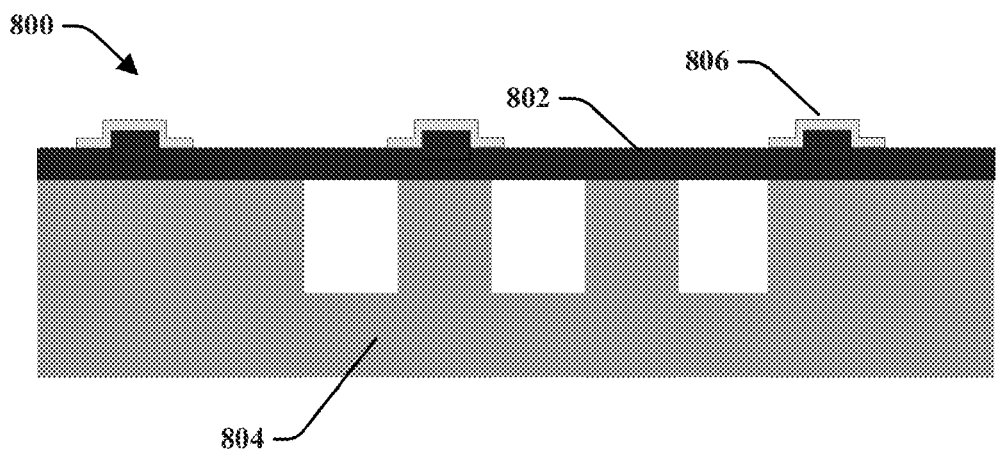
FIG. 8 depicts a non-limiting schematic diagram of an exemplary MEMS surface with a roughened silicon layer with deposited and patterned germanium according to various non-limiting aspects of the subject disclosure.

Turning now to FIGS. 6-8, illustrated are non-limiting schematic diagrams 600, 700, and 800 of an exemplary wafer surface with a deposited aluminum film over a silicon surface, an aluminum film and mixed aluminum-silicon alloy removed, and germanium deposition and patterning according to various non-limiting aspects of the subject disclosure.

In FIG. 6, a wafer 604 can have a silicon substrate 608 for a surface. The wafer 604 can include one more cavities (e.g., cavity 610) where a MEMs device or sensor may be placed or located. Interconnect points 606 can be formed on the surface of the substrate 608 and these anchors or standoffs are used to connect the wafer 604 to a CMOS wafer. Since the silicon substrate 408 will be in contact with the CMOS wafer, it would be ideal to roughen the surface of the substrate to reduce possible stiction forces.

To that end, a thin layer of aluminum 602 can be deposited over the silicon substrate 608 and interconnect points 606 after a standoff etch that formed the interconnect points 606. After deposition, the aluminum 602 and silicon substrate 608 can be annealed. During the annealing process, the aluminum 602 and silicon substrate 608 can be heated to a temperature where the portion of the aluminum 602 and the silicon substrate 608 that are in contact with each other partially melt and interdiffuse forming a silicon-aluminum alloy. The temperature to which the materials are heated can be the temperature at which the aluminum and silicon form a eutectic alloy, which is a lower temperature than the melting points of either silicon or germanium. In an embodiment, the eutectic temperature where aluminum and silicon interdiffuse and form the alloy is around 600 degrees Celsius. The silicon and aluminum can thus be heated to around or at least 600 degrees Celsius for a predetermined period of time.

In FIG. 7, the aluminum layer 602 has been removed from the entire surface of the silicon substrate 702, including the interconnect points 704. The silicon-aluminum alloy that was formed during the annealing has also been removed, leaving behind a surface of the silicon substrate 702 that has been roughened.

In FIG. 8 to prepare the wafer 804 for bonding to another wafer, germanium 806 can be deposited and patterned over the interconnect points, leaving the rest of the silicon substrate 802 bare.

Figure 9:
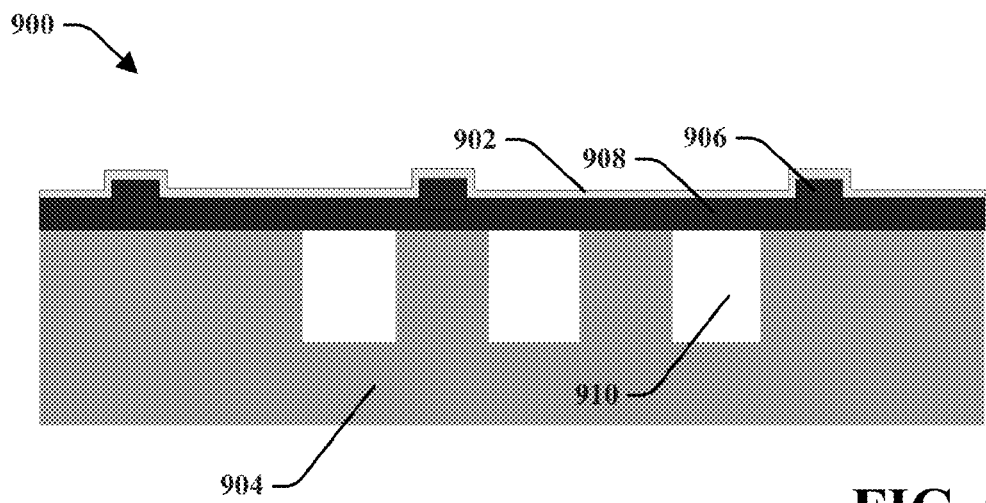
FIG. 9 depicts a non-limiting schematic diagram of an exemplary MEMS surface with a deposited germanium layer over a silicon substrate according to various non-limiting aspects of the subject disclosure.
Figure 10:
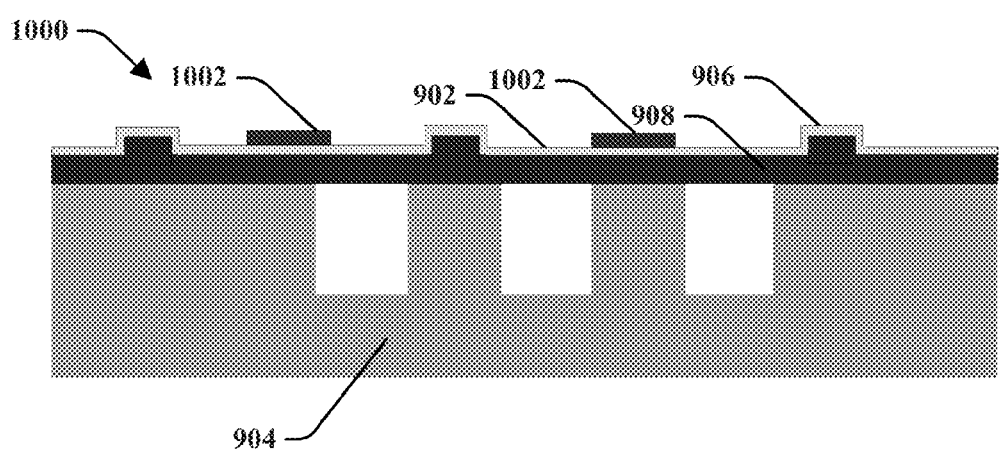
FIG. 10 depicts a non-limiting schematic diagram of an exemplary MEMS surface with a deposited aluminum layer over a previously deposited germanium layer according to various non-limiting aspects of the subject disclosure.
Figure 11:
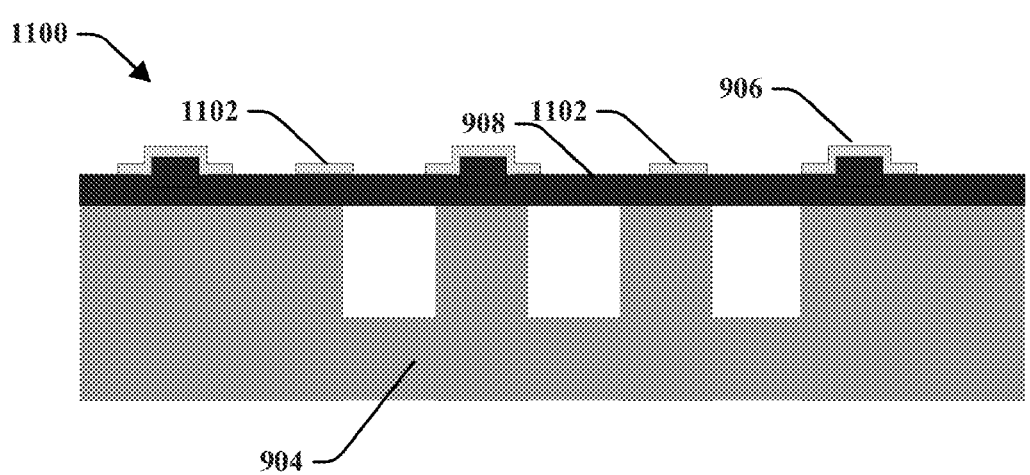
FIG. 11 depicts a non-limiting schematic diagram of an exemplary MEMS surface with a roughened germanium contact surface according to various non-limiting aspects of the subject disclosure.

Turning now to FIGS. 9-11, illustrated are non-limiting schematic diagrams 900, 1000 and 1100 of an exemplary wafer surface with deposited germanium layer over a silicon substrate, and a deposited aluminum layer over a portion of the germanium layer according to various non-limiting aspects of the subject disclosure.

FIG. 9 depicts a non-limiting schematic diagram 900 of an exemplary wafer surface with a deposited germanium layer over a silicon substrate according to various non-limiting aspects of the subject disclosure. A germanium layer 902 can be deposited over a wafer 904 that a has a silicon substrate 908. The wafer 904 can include one more cavities (e.g., cavity 910) where a sensor or other electronic circuits may be placed or located. Interconnect point 906 can be formed on the surface of the substrate 908 and these anchors or standoffs are used to connect the wafer 904 to a CMOS wafer.

A thin layer of germanium 902 can be deposited over the silicon substrate 908 and interconnect points 906 after a standoff etch that formed the interconnect points 906. After deposition, in FIG. 10, an aluminum layer 1002 can be deposited over a portion of the germanium 902. At this time, the aluminum 1002 and germanium 902 are annealed, being heated up to a predetermined temperature of at least 400 degrees Celsius for a predetermined length of time to allow the aluminum 1002 and germanium 902 to interdiffuse forming an aluminum-germanium alloy.

In FIG. 11, the aluminum 1002 and interdiffused aluminum-germanium alloy have been removed, in addition to the portions of germanium 902 that were not underneath the aluminum 1002 and the portions on the interconnects 906. The roughened germanium surfaces 1102 that are left behind are then patterned and prepared for bonding to another wafer.

While several example embodiments are provided, it is noted that aspects of this disclosure are not limited to the exemplary embodiments. As such, the various embodiments disclosed herein can be applied to numerous applications. In exemplary embodiments, systems and methods described herein can be applied to smart phones, hand held gaming devices, hand held electronics, notebook computers, desktop computers, and the like. Such systems can utilize aspects disclosed herein to determine characteristics associated with acoustic signals, such as for speech recognition, pressure detection, or the like.

In view of the subject matter described supra, methods that can be implemented in accordance with the subject disclosure will be better appreciated with reference to the flowcharts of FIGS. 12-15. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

Figure 12:
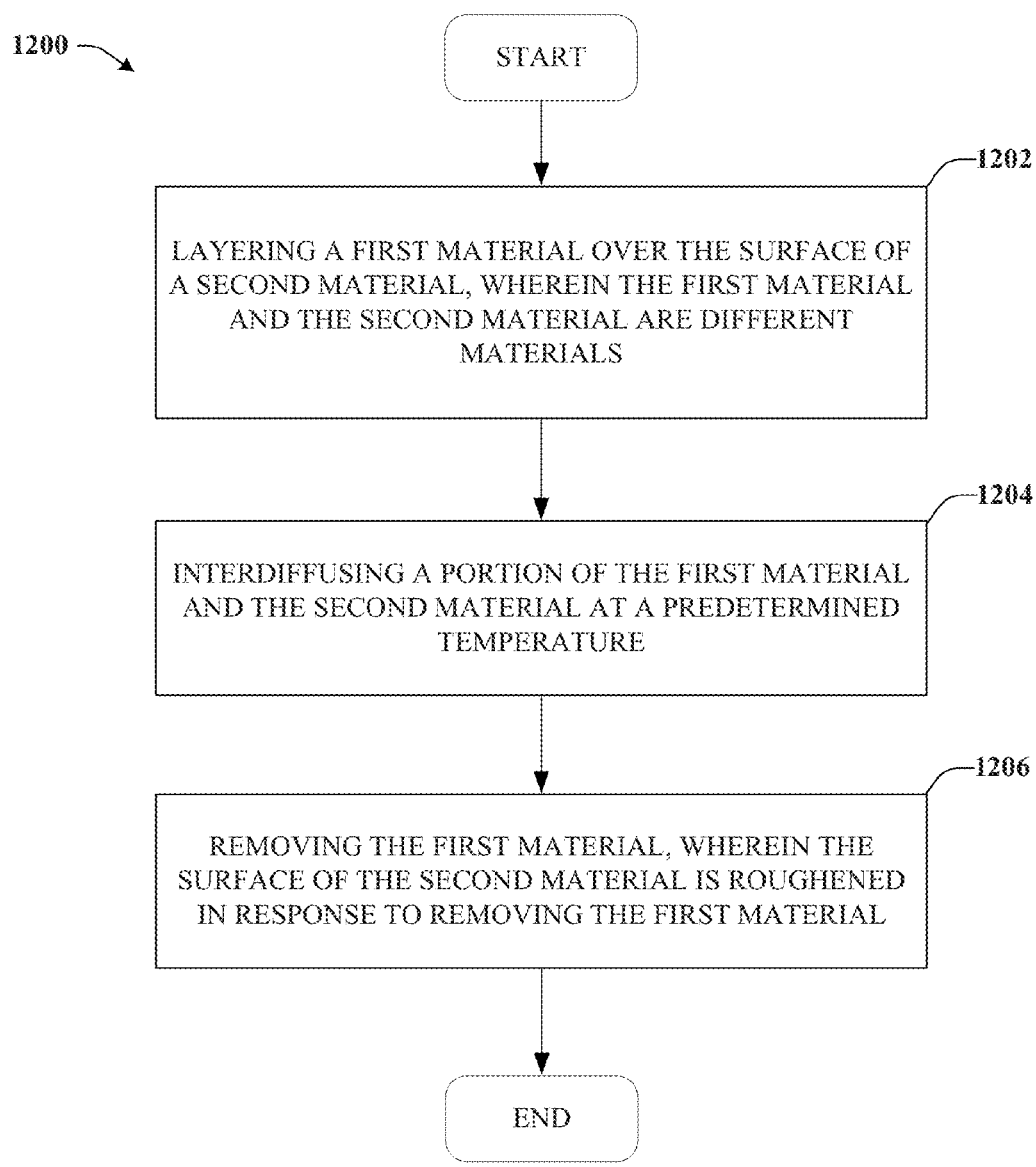
FIG. 12 depicts an exemplary flowchart of non-limiting methods associated with a roughening a surface according to various non-limiting aspects of the disclosed subject matter.

FIG. 12 depicts an exemplary flowchart of non-limiting methods associated with a roughening a surface according to various non-limiting aspects of the disclosed subject matter. As a non-limiting example, exemplary method 1200 can facilitate roughening a surface of a wafer (e.g., diagrams 100, 200, and 300, etc.). The method 1200 can start at 1202 where the method includes layering a first material over the surface of a second material, wherein the first material and the second material are different materials. In a first embodiment, the first material can be germanium and the second material can be silicon. In a second embodiment, the first material can be aluminum and the second material can be silicon. In a third embodiment, the first material can be aluminum and the second material can be germanium.

At 1204, the method includes interdiffusing a portion of the first material and the second material at a predetermined temperature. At a eutectic temperature, a portion of the first material and the second material that touch can change phase from solid to liquid and interdiffuse, even though the predetermined temperature is below both the melting points of the first and second materials. In the first embodiment with germanium and silicon, the predetermined temperature can be 700 degrees Celsius or above. In the second embodiment with aluminum and silicon, the predetermined temperature can be 600 degrees Celsius or above. In the third embodiment with aluminum and germanium, the predetermined temperature can be 400 degrees Celsius or above.

At 1206, the method includes removing the first material, wherein the surface of the second material is roughened in response to removing the first material. When the first material is removed, the alloy formed by the interdiffusion of the first and second materials is also removed, leaving behind just the second material which is roughened. In another method the interdiffused alloy may remain to form a roughened surface.

Figure 13:
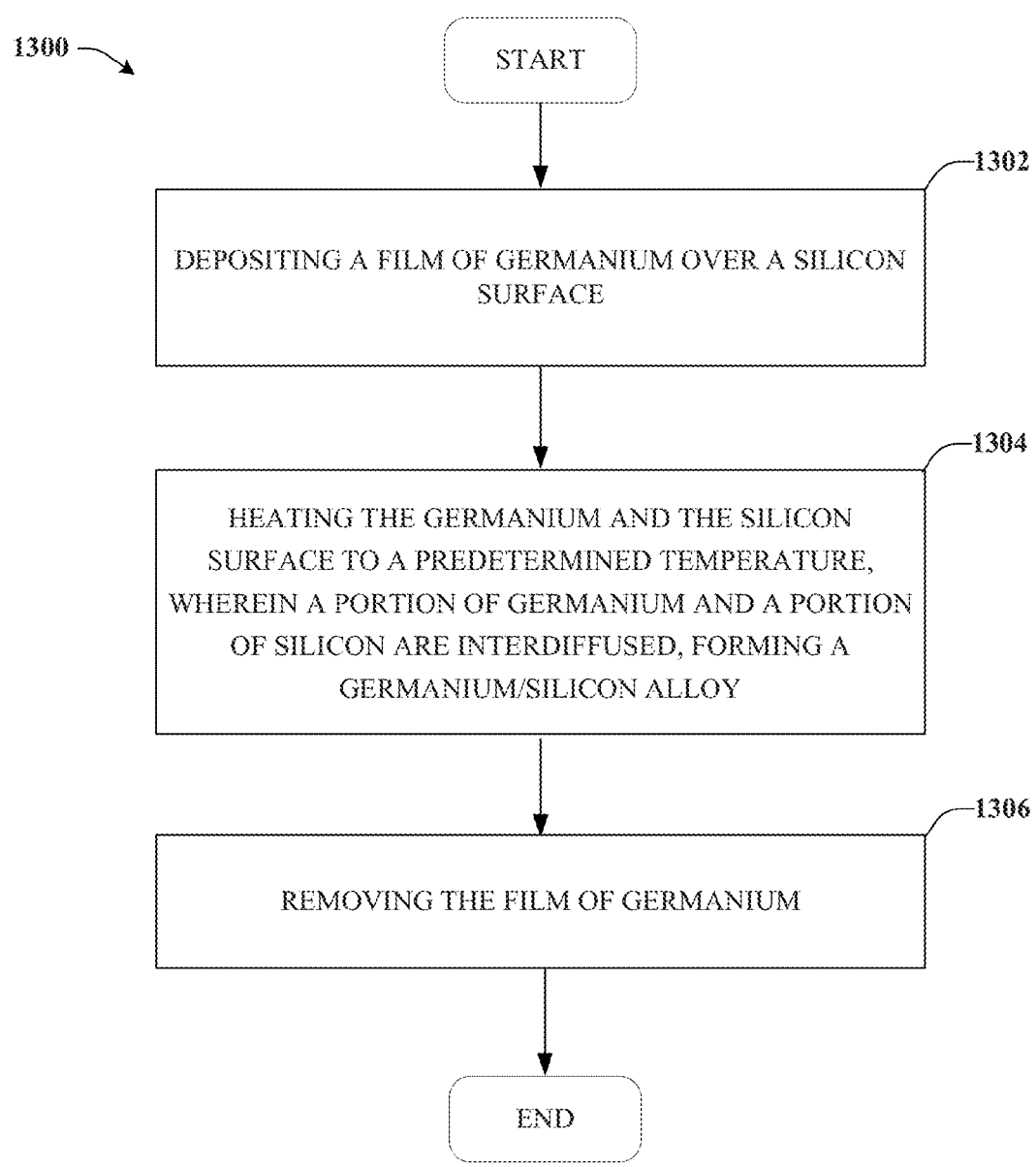
FIG. 13 depicts an exemplary flowchart of non-limiting methods associated with a roughening a silicon surface according to various non-limiting aspects of the disclosed subject matter.

FIG. 13 depicts an exemplary flowchart of non-limiting methods associated with a roughening a silicon surface according to various non-limiting aspects of the disclosed subject matter. The method can begin at 1302, where the method includes depositing a film of germanium over a silicon surface. At 1304, the method includes heating the germanium and the silicon surface to a predetermined temperature, wherein a portion of germanium and a portion of silicon are interdiffused, forming a germanium/silicon alloy. At 1306, the method includes removing the film of germanium.

Figure 14:
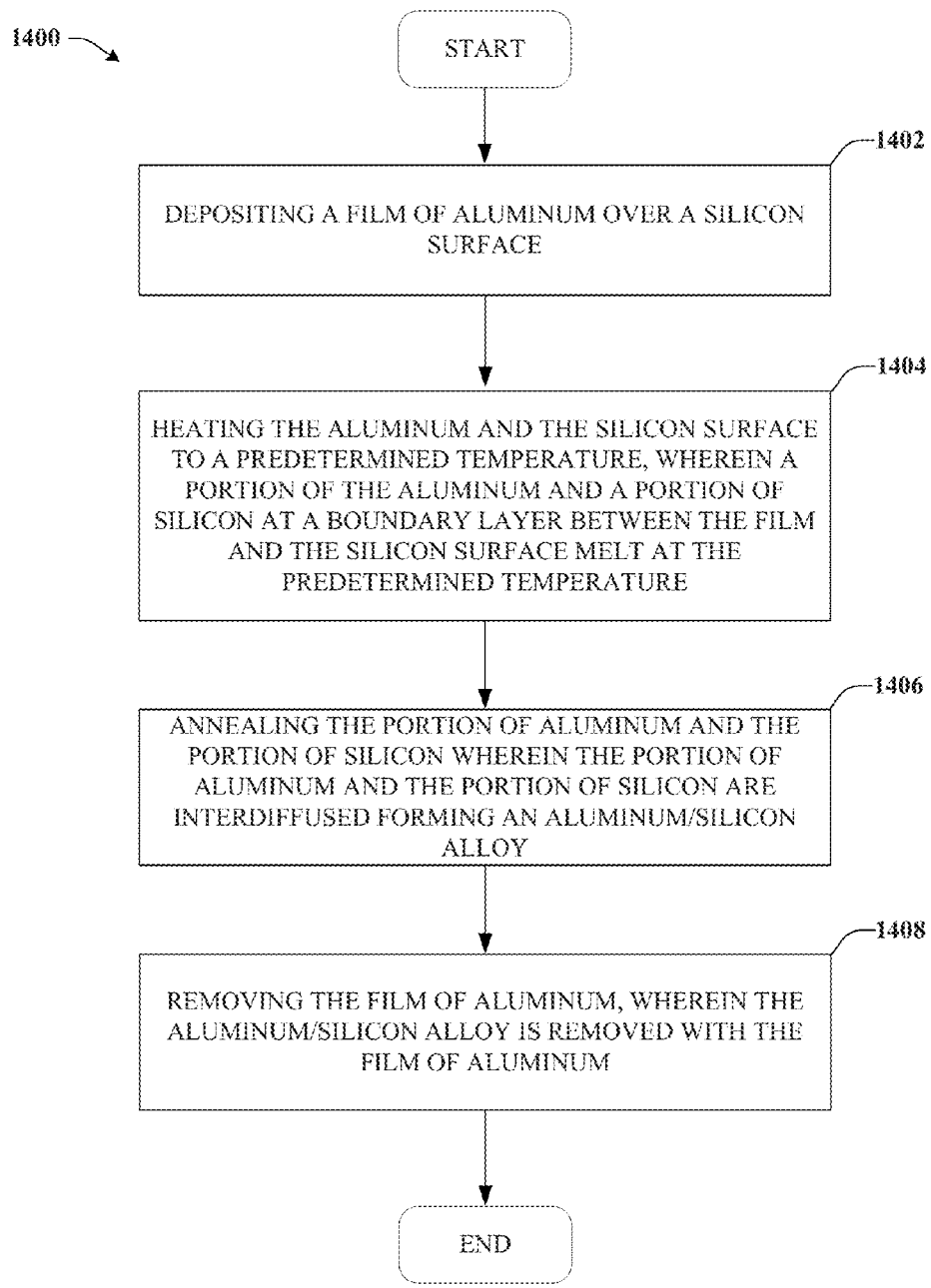
FIG. 14 depicts an exemplary flowchart of non-limiting methods associated with a roughening a silicon surface according to various non-limiting aspects of the disclosed subject matter.

FIG. 14 depicts an exemplary flowchart of non-limiting methods associated with a roughening a silicon surface according to various non-limiting aspects of the disclosed subject matter. The method can begin at 1402, where the method includes depositing a film of aluminum over a silicon surface. At 1404, the method includes heating the aluminum and the silicon surface to a predetermined temperature, wherein a portion of the aluminum and a portion of silicon at a boundary layer between the film and the silicon surface melt at the predetermined temperature. At 1406, the method includes annealing the portion of aluminum and the portion of silicon wherein the portion of aluminum and the portion of silicon are interdiffused forming an aluminum/ silicon alloy and at 1408, the method includes removing the film of aluminum, wherein the aluminum/silicon alloy is removed with the film of aluminum.

Figure 15:
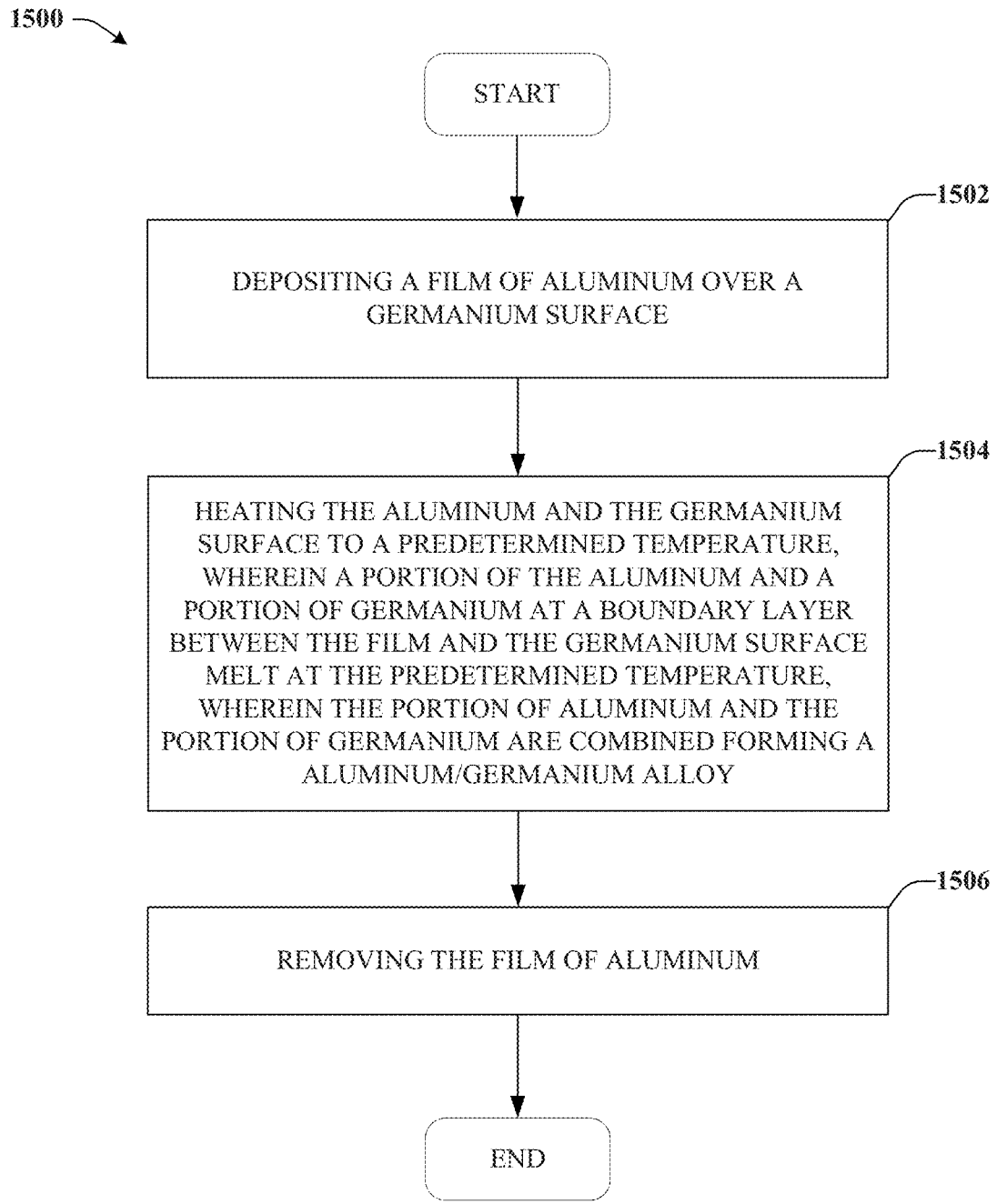
FIG. 15 depicts an exemplary flowchart of non-limiting methods associated with a roughening a germanium surface according to various non-limiting aspects of the disclosed subject matter.

FIG. 15 depicts an exemplary flowchart of non-limiting methods associated with a roughening a germanium surface according to various non-limiting aspects of the disclosed subject matter. The method can begin at 1502, where the method includes depositing a film of aluminum over a germanium surface. At 1504, the method includes heating the aluminum and the germanium surface to a predetermined temperature, wherein a portion of the aluminum and a portion of germanium at a boundary layer between the film and the germanium surface melt at the predetermined temperature, wherein the portion of aluminum and the portion of germanium are combined forming a aluminum/germanium alloy. At 1506, the method includes removing the film of aluminum.

It is to be appreciated that various components described herein can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What has been described above includes examples of the embodiments of the present disclosure. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize. Moreover, use of the term "an embodiment" or "one embodiment" throughout is not intended to mean the same embodiment unless specifically described as such.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned diagrams/systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A method for roughening a surface, comprising:
   layering a first material over a first surface of a second material having a first roughness, wherein the first material and the second material are different materials;
   interdiffusing a portion of the first material and the second material at a predetermined temperature, wherein the interdiffusing results in formation of a eutectic alloy layer formed between the first material and the second material; and
   removing the first material, wherein the removing results in a second surface of the eutectic alloy layer having a second roughness that is greater than the first roughness.

2. The method of claim 1, wherein the first material is germanium and the second material is silicon.

3. The method of claim 1, wherein the first material is aluminum and the second material is silicon.

4. The method of claim 1, wherein the first material is aluminum and the second material is germanium.

5. The method of claim 2, further comprising:
   patterning the germanium on an interconnect point for bonding to a wafer.

6. The method of claim 5, wherein the wafer comprises electronic circuits.

7. The method of claim 3, further comprising:
   depositing the germanium on an interconnect point of a third surface of a first wafer and patterning the germanium for bonding to a second wafer.

8. The method of claim 7, wherein the second wafer is a microelectromechanical systems (MEMS) wafer.

9. The method of claim 1, further comprising:
   patterning the second material, wherein the first material is layered after the patterning of the second material.

10. The method of claim 1, wherein the interdiffusing comprises heating the portion to a determined temperature that is lower than melting temperatures of the first material and the second material.

11. The method of claim 2, wherein the interdiffusing comprises
    heating the portion to at least 700° C.

12. The method of claim 3, wherein the interdiffusing comprises
    heating the portion to at least 600° C.

13. The method of claim 4, wherein the interdiffusing comprises
    heating the portion to at least 400° C.

14. The method of claim 1, further comprising:
    removing the eutectic alloy layer, wherein the removing the eutectic alloy layer results in the first surface having a third roughness that is greater than the first roughness.

15. A method, comprising:
    depositing a film of germanium over a silicon surface having a first roughness;
    heating the film of germanium and the silicon surface to a predetermined temperature, wherein a first portion of germanium and a second portion of silicon are interdiffused, forming a eutectic germanium-silicon alloy layer; and
    removing the film of germanium, wherein the removing results in exposing a surface having a second roughness that is greater than the first roughness.

16. The method of claim 15, wherein the heating comprises heating the film of germanium and the silicon surface to the predetermined temperature that is lower than melting temperatures of germanium and silicon.

17. The method of claim 16, wherein the heating comprises heating the film of germanium and the silicon surface to at least 700° C.

18. The method of claim 15, further comprising:
    patterning the film of germanium on an interconnect point on the silicon surface for bonding to a wafer.

19. The method of claim 18, further comprising:
    removing the eutectic germanium-silicon alloy layer, wherein the removing the eutectic germanium-silicon alloy layer results in exposure of the silicon surface having a third roughness that is greater than the first roughness.

20. A method to roughen a surface, comprising:
    depositing a film of aluminum over a silicon surface having a first roughness;
    heating the film of aluminum and the silicon surface to a predetermined temperature;
    annealing a first portion of the film of aluminum and a second portion of silicon wherein the first portion of aluminum and the second portion of silicon are interdiffused forming a eutectic aluminum-silicon alloy layer; and
    removing the film of aluminum, wherein the removing results in exposing a surface having a second roughness that is greater than the first roughness.

21. The method of claim 20, wherein the heating comprises heating the film of aluminum and the silicon surface to at least 600° C.

22. The method of claim 20, further comprising:
    depositing a layer of germanium over an interconnect point; and
    patterning the germanium on the interconnect point for bonding to a microelectromechanical systems (MEMS) wafer.

23. A method, comprising:
    depositing a film of aluminum over a germanium surface having a first roughness;
    heating the film of aluminum and the germanium surface to a defined temperature, wherein the heating results in a combination of a first portion of the film of aluminum and a second portion of germanium surface at a boundary layer between the film and the germanium surface melt to form a eutectic aluminum-germanium alloy; and
    removing the film of aluminum, wherein the removing results in exposure of a surface having a second roughness that is greater than the first roughness.

24. The method of claim 23, wherein the removing comprises removing the film of aluminum and the eutectic aluminum-germanium alloy via an etching process.

25. The method of claim 23, wherein the heating comprises heating the film of aluminum and the germanium surface to at least 400° C.

26. The method of claim 23, wherein the germanium is deposited over a silicon substrate.

27. The method of claim 26, where the silicon substrate comprises electronics circuit.

28. The method of claim 23, wherein the germanium is deposited over a patterned silicon nitride layer.

* * * * *